(12) United States Patent
Narita et al.

(10) Patent No.: US 11,940,303 B2
(45) Date of Patent: Mar. 26, 2024

(54) POSITION DETECTION DEVICE AND POSITION DETECTION METHOD

(71) Applicant: SONY CORPORATION, Tokyo (JP)

(72) Inventors: Tetsuya Narita, Tokyo (JP); Masahiro Fujita, Saitama (JP)

(73) Assignee: SONY CORPORATION, Tokyo (JP)

( * ) Notice: Subject to any disclaimer, the term of this patent is extended or adjusted under 35 U.S.C. 154(b) by 214 days.

(21) Appl. No.: 16/489,029

(22) PCT Filed: Mar. 1, 2018

(86) PCT No.: PCT/JP2018/007815
§ 371 (c)(1),
(2) Date: Aug. 27, 2019

(87) PCT Pub. No.: WO2018/190018
PCT Pub. Date: Oct. 18, 2018

(65) Prior Publication Data
US 2020/0003586 A1    Jan. 2, 2020

(30) Foreign Application Priority Data
Apr. 13, 2017   (JP) .................................. 2017-079612

(51) Int. Cl.
*G01D 5/244* (2006.01)
*G01B 7/30* (2006.01)
(Continued)

(52) U.S. Cl.
CPC ........... *G01D 5/24419* (2013.01); *G01B 7/30* (2013.01); *G01D 5/2455* (2013.01); *G01R 33/06* (2013.01); *G01D 5/34794* (2021.05)

(58) Field of Classification Search
CPC ........ G01D 5/142; G01D 5/145; G01D 5/147; G01D 5/2454; G01D 5/2455;
(Continued)

(56) References Cited

U.S. PATENT DOCUMENTS 5,012,238 A  *  4/1991  Hayashi .............. G01D 5/2455
                                                      341/11
2002/0041241 A1    4/2002  Oberhauser
(Continued)

FOREIGN PATENT DOCUMENTS

CN    101153792 A    4/2008
CN    101726321 A    6/2010
(Continued)

OTHER PUBLICATIONS

Jul. 8, 2020, European Search Report issued for related EP application No. 18783714.1.

*Primary Examiner* — David M Schindler
(74) *Attorney, Agent, or Firm* — Paratus Law Group, PLLC

(57) ABSTRACT

There is provided a position detection device to suppress an influence of a signal distortion due to a processing error or the like, the position detection device including: a reference position calculation unit that calculates a reference position of a moving body on the basis of a first signal and a second signal, the first signal being detected from a first track provided on the moving body and having a scale of predetermined cycles, and the second signal being detected from a second track provided on the moving body and having a scale of cycles less than the predetermined cycles; a slit specifying unit that specifies a slit corresponding to a position of the moving body; an in-slit position calculation unit that calculates an in-slit position of the moving body in the specified slit; and a correction unit that corrects an absolute position of the moving body.

13 Claims, 16 Drawing Sheets

(51) Int. Cl.
*G01D 5/245* (2006.01)
*G01R 33/06* (2006.01)
*G01D 5/347* (2006.01)

(58) Field of Classification Search
CPC ............... G01D 5/2457; G01D 5/2458; G01D 5/34776; G01D 5/34784; G01D 5/34792; G01D 5/24419; G01D 5/24404; G01D 5/24414; G01D 5/244; G01B 7/30; G01R 33/06

See application file for complete search history.

(56) References Cited

U.S. PATENT DOCUMENTS

| | | | |
|---|---|---|---|
| 2003/0062470 A1 | 4/2003 | Burgschat et al. | |
| 2009/0315544 A1* | 12/2009 | Takahashi | G01P 13/04 324/207.25 |
| 2010/0241383 A1 | 9/2010 | Teraguchi | |
| 2011/0187355 A1* | 8/2011 | Dixon | G01P 3/487 324/207.25 |
| 2011/0309824 A1* | 12/2011 | Takahashi | F16C 41/007 324/207.13 |
| 2013/0200886 A1* | 8/2013 | Kirste | G01D 5/2492 324/207.22 |
| 2014/0028294 A1* | 1/2014 | Granig | G01R 33/025 324/207.12 |

FOREIGN PATENT DOCUMENTS

| | | |
|---|---|---|
| CN | 101839728 A | 9/2010 |
| CN | 102080971 A | 6/2011 |
| CN | 103105180 A | 5/2013 |
| DE | 102013218768 A1 | 3/2015 |
| EP | 0526730 A1 | 2/1993 |
| EP | 2492647 A2 | 8/2012 |
| JP | S63-165711 A | 7/1988 |
| JP | 2012-088116 A | 5/2012 |
| JP | 2013-096813 A | 5/2013 |

* cited by examiner

FIG. 8

Slit NUMBER 6bit(0 TO 63): 0 0 1 1 0 1

+

INTERPOLATION ANGLE: 0 1 1 0 1 0 1 1 0 1 0 1 0 1

=

ABSOLUTE ANGLE: 0 0 1 1 0 1 0 1 1 0 1 0 1 1 0 1 0 1 0 1

IN CASE WHERE NUMBER OF TEETH OF Track A IS 64 AND x=8

Track A: 64 CYCLES
Track B: 63 CYCLES
Track C: 56 CYCLES

IN CASE WHERE NUMBER OF TEETH OF Track A IS 64
Track A: 64 CYCLES
Track C: 63 CYCLES $$\theta_{ref} = atan2(cos_A, sin_A) - atan2(cos_B, sin_B)$$

CALCULATE AREA NUMBER CORRESPONDING TO CURRENT ANGLE

POSITION DETECTION DEVICE AND POSITION DETECTION METHOD

CROSS REFERENCE TO PRIOR APPLICATION

This application is a National Stage Patent Application of PCT International Patent Application No. PCT/JP2018/007815 (filed on Mar. 1, 2018) under 35 U.S.C. § 371, which claims priority to Japanese Patent Application No. 2017-079612 (filed on Apr. 13, 2017), which are all hereby incorporated by reference in their entirety.

TECHNICAL FIELD

The present disclosure relates to a position detection device and a position detection method.

BACKGROUND ART

Conventionally, for example, Patent Document 1 discloses an absolute encoder having a scale unit having at least a main track, a first address track, and a second address track and processing means detecting a phase difference from the scale unit, performing address determination on the basis of a plurality of detected phase differences, and calculating a position or an angle of a target to be measured.

CITATION LIST

Patent Document

Patent Document 1: Japanese Patent Application Laid-Open No. 2013-96813

SUMMARY OF THE INVENTION

Problems to be Solved by the Invention

In a technology described in the above Patent Document, there is a possibility of making an erroneous determination with an adjacent address, and a position within a wavelength in each track is thus extracted in a form of a phase modulation signal. Therefore, there is a problem that a circuit for modulation is required, such that mounting becomes complicated. Furthermore, in accordance with an increase in the number of tracks, there is a possibility that a circuit configuration will become complicated and a manufacturing cost will increase.

Therefore, it has been required to suppress erroneous determination of a position detection device with a simple configuration.

Solutions to Problems

According to the present disclosure, there is provided a position detection device including: a reference position calculation unit that calculates a reference position of a moving body on the basis of a first signal and a second signal, the first signal being detected from a first track provided on the moving body and having a scale of predetermined cycles, and the second signal being detected from a second track provided on the moving body and having a scale of cycles less than the predetermined cycles; a slit specifying unit that specifies a slit corresponding to a position of the moving body among a plurality of slits on the basis of the reference position, the plurality of slits being obtained by dividing a moving range of the moving body; an in-slit position calculation unit that calculates an in-slit position of the moving body in the specified slit on the basis of the first signal; and a correction unit that corrects an absolute position of the moving body on the basis of the absolute position and the reference position, the absolute position being calculated on the basis of the specified slit and the in-slit position.

Furthermore, according to the present disclosure, there is provided a position detection method including: calculating a reference position of a moving body on the basis of a first signal and a second signal, the first signal being detected from a first track provided on the moving body and having a scale of predetermined cycles, and the second signal being detected from a second track provided on the moving body and having a scale of cycles less than the predetermined cycles; specifying a slit corresponding to a position of the moving body among a plurality of slits on the basis of the reference position, the plurality of slits being obtained by a moving range of the moving body; calculating an in-slit position of the moving body in the specified slit on the basis of the first signal; and correcting an absolute position of the moving body on the basis of the absolute position and the reference position, the absolute position being calculated on the basis of the specified slit and the in-slit position.

Effects of the Invention

As described above, according to the present disclosure, it is possible to suppress an erroneous determination of the position detection device with a simple configuration.

Note that the effect described above is not necessarily restrictive, and any effect set forth in the present specification or other effects that can be grasped from the present specification may be accomplished together with or instead of the effect described above.

BRIEF DESCRIPTION OF DRAWINGS

FIG. 8 is a schematic view illustrating an absolute angle represented by a slit number and an interpolation angle.

MODE FOR CARRYING OUT THE INVENTION

Figure 1:
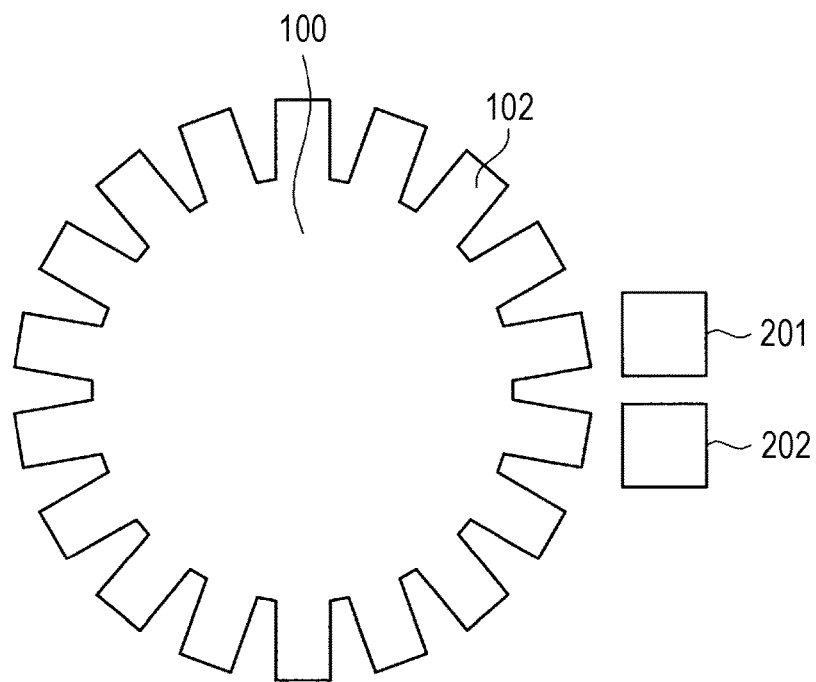
FIG. 1 is a schematic view illustrating a configuration of an encoder which is a premise of the present disclosure.

Hereinafter, preferred embodiments of the present disclosure will be described in detail with reference to the accompanying drawings. Note that in the present specification and the drawings, components having substantially the same functional configuration will be denoted by the same reference numerals and an overlapping description will be omitted.

Note that a description will be given in the following order.

1. Premise Technology
2. Configuration Example of Position Detection Device According to Present Embodiment
3. Configuration Example in Case of Three Tracks 1. Premise Technology FIG. 1 is a schematic view illustrating a configuration of an encoder (position detection device) which is a premise of the present disclosure. The encoder includes a rotating body (moving body) 100, a detection unit 201, and a detection unit 202.

The rotating body 100 is configured as, for example, a rotating body having a gear shape or a ruggedness or a rotating body in which N poles and S poles are alternately magnetized. The detection unit 201 and the detection unit 202 detect changes in magnetism, light, and the like due to rotation of the rotating body 100.

The rotating body 100 illustrated in FIG. 1 includes eighteen projections 102, and outputs eighteen cycles of signal when it rotates once. Note that the rotating body 100 in which the projections 102 are arranged in a circumferential direction and rotate with respect to a rotation center as illustrated in FIG. 1, but the projections 102 may be arranged in a linear shape. The present embodiment can be applied to an encoder detecting a rotation angle in a case where the projections 102 are arranged in the circumferential direction, and can be applied to a linear encoder in a case where the projections 102 are arranged in the linear shape.

Examples of the detection units 201 and 202 can include a magnetic sensor, a light receiving element and the like. The present embodiment is applicable to various encoders such as a magnetoresistive encoder, a magnetic (magnetization) encoder, an electric induction type encoder, and an optical encoder.

Figure 2:
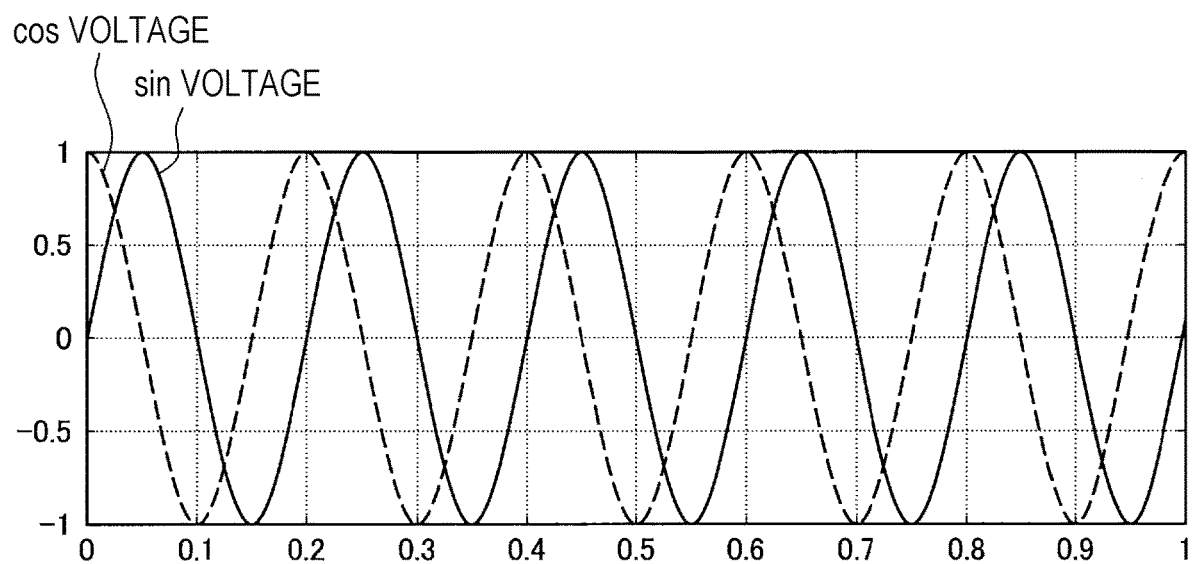
FIG. 2 is a schematic view illustrating output signals of detection units.

FIG. 2 is a schematic view illustrating output signals of the detection unit 201 and the detection unit 202. As illustrated in FIG. 2, two sinusoidal voltage signals (referred to as a sin voltage and a cos voltage) having a phase difference of 90° therebetween are obtained by the detection units 201 and 202, from one track of the rotating body 100. In other words, the detection units 201 and 202 are arranged at positions where the sin voltage and the cos voltage having the phase difference of 90° therebetween are obtained. A cycle of each of the sin voltage and the cos voltage is the same as the number of projections 102 of the rotating body 100. If the number of sets of the detection unit 201 and the detection unit 202 increases, the number of obtained signals also increases. Each of the sin voltage and the cos voltage is obtained by converting a change in a physical quantity detected by the detection unit 201 and the detection unit 202 when the rotating body 100 rotates into a voltage. For example, in a case of a magnetic encoder, a change in a magnetic flux density is converted into a voltage by the detection unit 201 and the detection unit 202.

Figure 3:
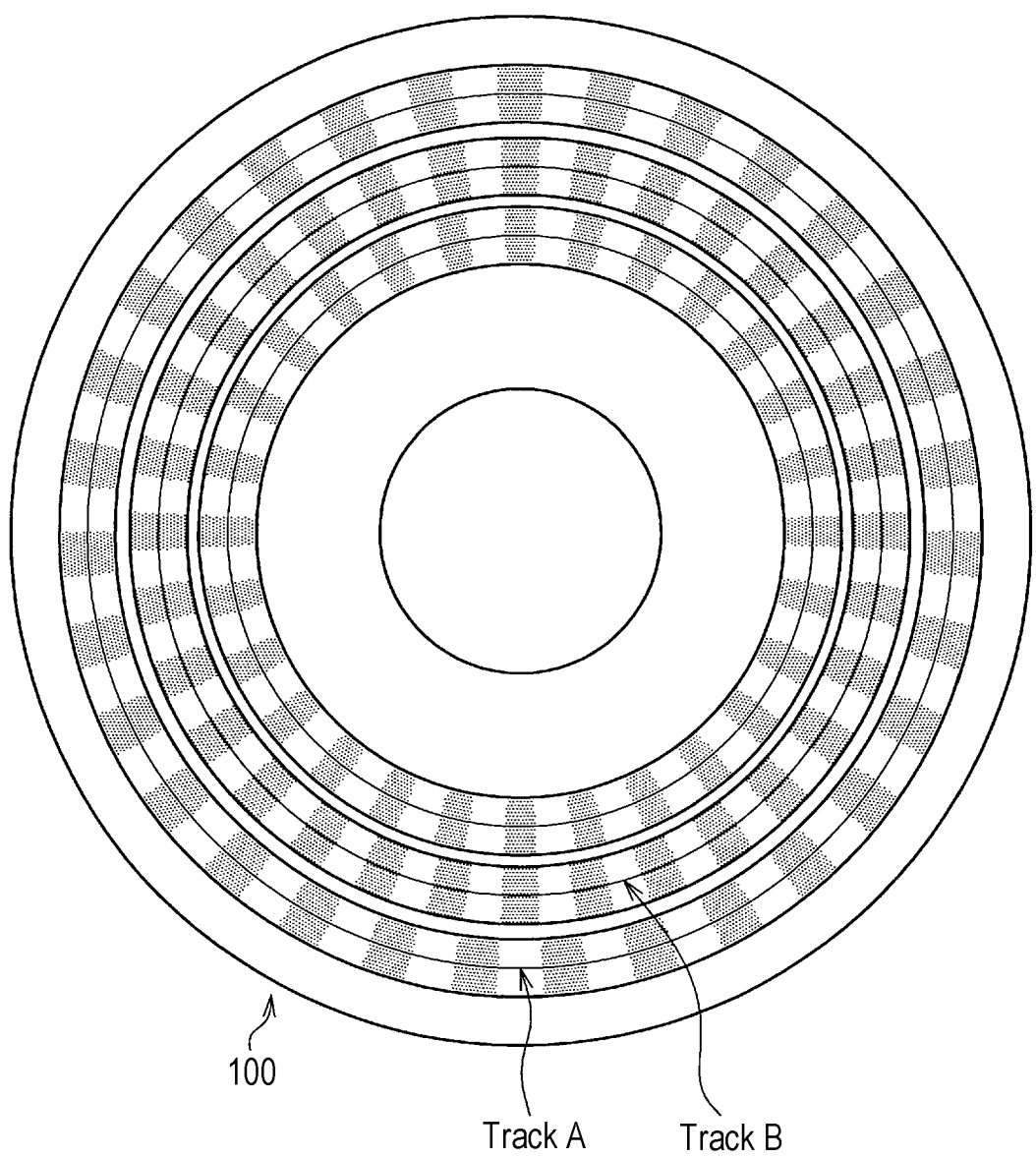
FIG. 3 is a schematic view illustrating a rotating body in more detail.

FIG. 3 is a schematic view illustrating the rotating body 100 in more detail. The rotating body 100 includes two tracks configured by forming a gear shape or a ruggedness or configured by alternately magnetizing N poles and S poles. Here, the two tracks are referred to as Track A and Track B, respectively. Teeth or ruggednesses having different cycles are formed or magnetization is performed, for example, in the respective tracks, and a cycle difference between. Track A and Track B is 1. For example, in a case where Track A has 64 cycles, Track B has 63 cycles. As described above, each track has a scale of a predetermined cycle by a ruggedness, a magnetization pattern or the like.

Figure 4:
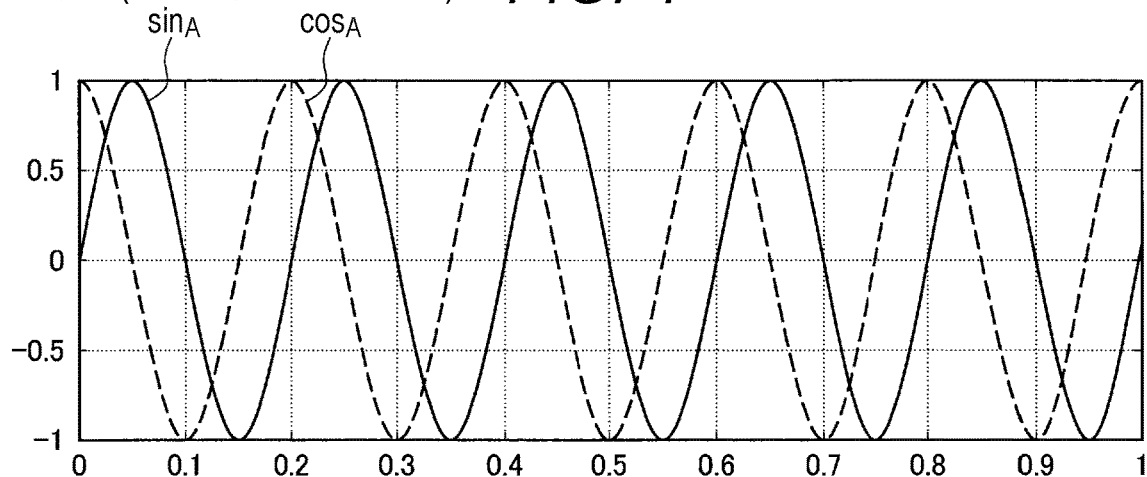
FIG. 4 is a characteristic diagram illustrating a sin voltage and a cos voltage of Track A and a sin voltage and a cos voltage of Track B.

FIG. 4 is a characteristic diagram illustrating a sin voltage $\sin_A$ and a cos voltage $\cos_A$ of Track A and a sin voltage $\sin_B$ and a cos voltage $\cos_B$ of Track B.

Figure 5:
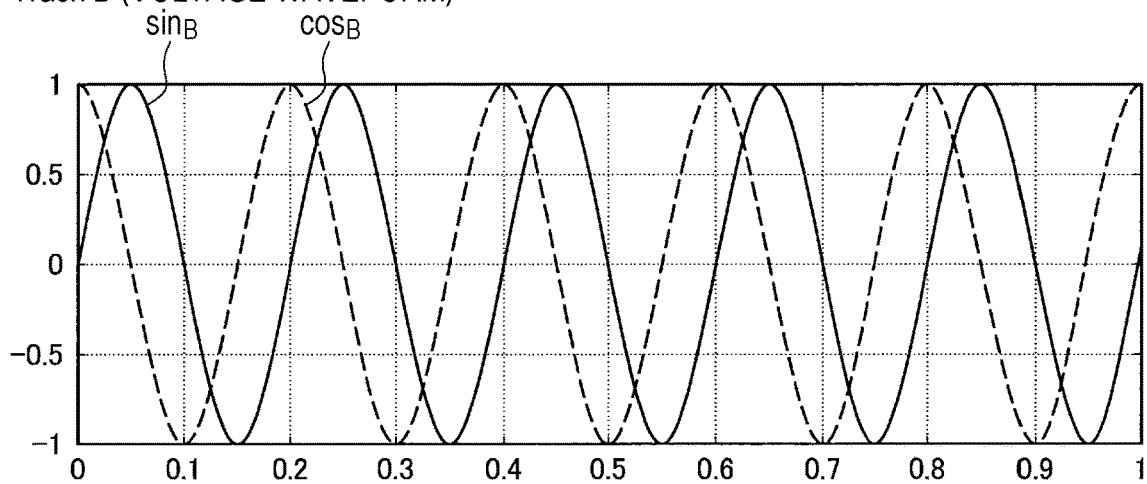
FIG. 5 is a block diagram illustrating a configuration of an encoder (position detection device) which is a premise of the present embodiment.
Figure 5:
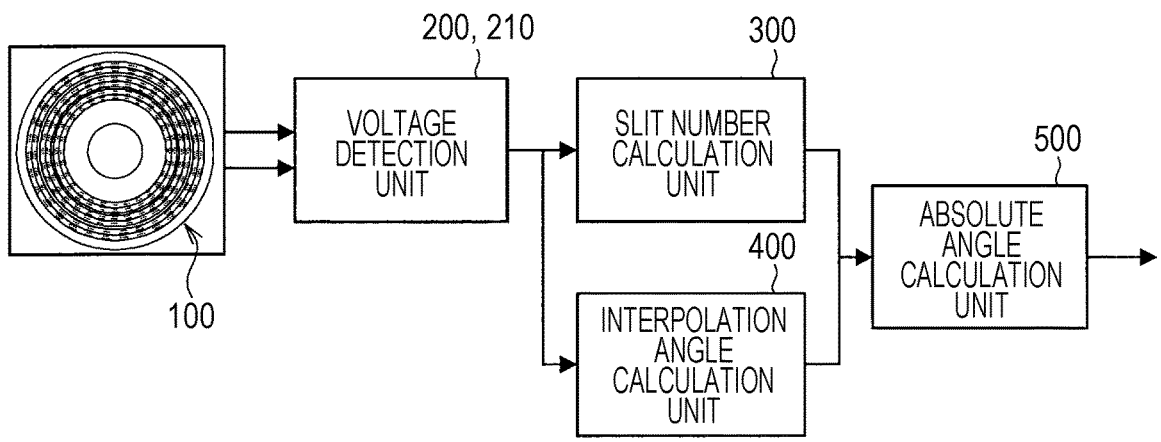

FIG. 5 is a block diagram illustrating a configuration of an encoder (position detection device) which is a premise of the present embodiment. As illustrated in FIG. 5, the encoder includes voltage detection units 200 and 210, a slit number calculation unit 300, an interpolation angle calculation unit 400, and an absolute angle calculation unit 500.

Figure 6:
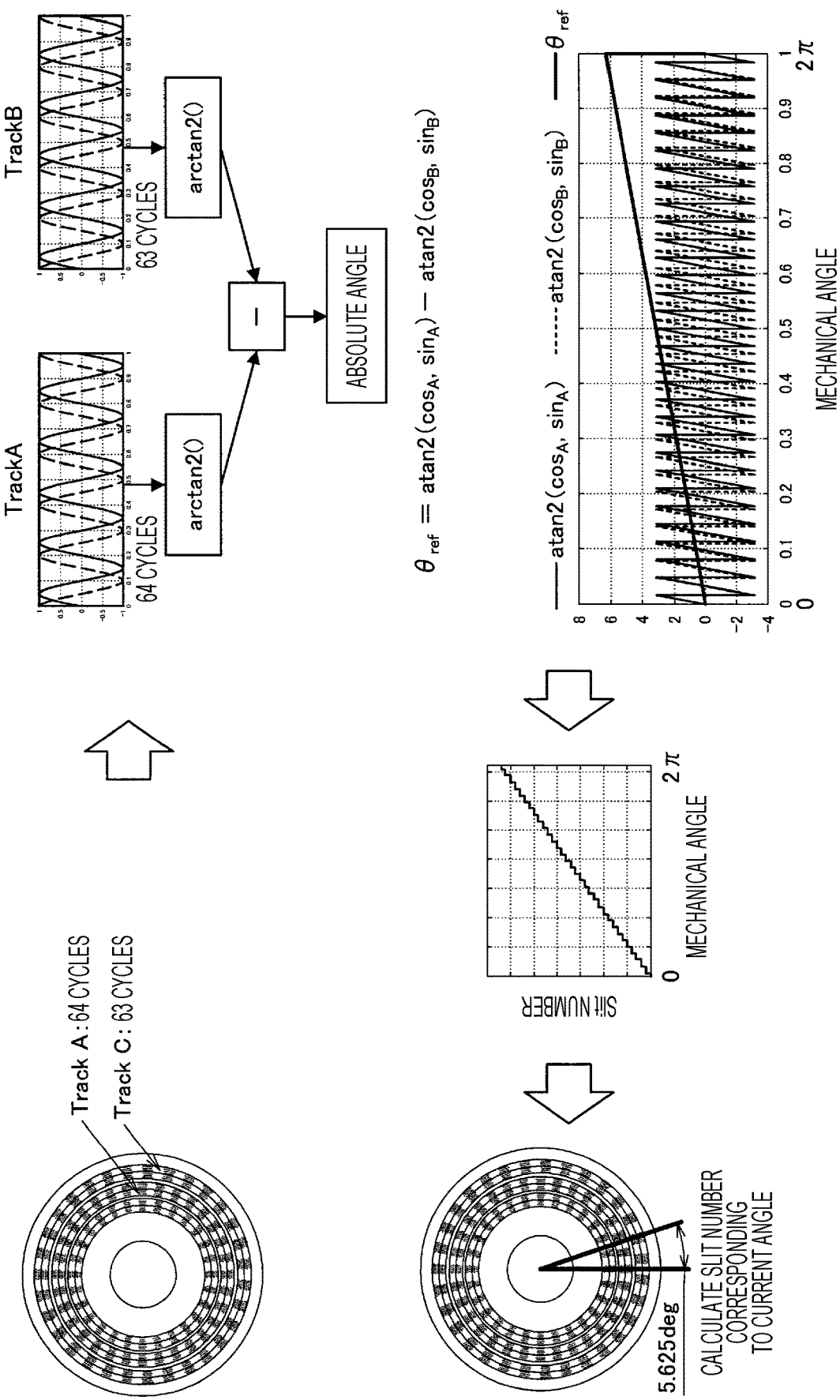
FIG. 6 is a schematic view for describing processing performed by a slit number calculation unit 300.

FIG. 6 is a schematic view for describing processing performed by the slit number calculation unit 300. Here, it is assumed that the rotating body 10C has Track A of 64 cycles and Track B of 63 cycles illustrated in FIG. 3. The detection units 200 and 210 are provided so as to correspond to tracks A and B, respectively. Each of the detection unit 200 and the detection unit 210 includes the detection unit 201 and the detection unit 202 illustrated in FIG. 1.

When calculating an absolute angle, arctangent2 (a tan(2) (hereinafter, referred to as a tan2 or arc tan2)) of sin voltages and cos voltages of each of Track A and Track B are calculated, and a difference between arctangent2 (a tan(2)) of the sin voltages and the cos voltages is calculated to obtain the absolute angle from a cycle difference (one cycle) between the tracks. As illustrated in FIG. 6, the absolute angle $\theta_{ref}$ can be obtained from the following Equation 1.

$$\theta_{ref} = a\tan2(\cos_A, \sin_A) - a\tan2(\cos_B, \sin_B) \quad (1)$$

More specifically, since Track A has 64 cycles, cycles of fluctuations of $\sin_A$ and $\cos_A$ are 64 cycles, respectively. Since calculating arctangent2 is equal to obtaining phases of $\sin_A$ and $\cos_A$ and $\sin_A$ and $\cos_A$ fluctuate in 64 cycles with respect to one period of the rotating body 100 (mechanical angle one period), the fluctuations of the phases (fluctuations of arctangent2) also occur in 64 cycles. Therefore, a calculation result of arctangent2 repeats an increase and decrease in 64 cycles. Since Track B has 63 cycles, a calculation result of arctangent2 repeats an increase and decrease in 63 cycles. Therefore, a $\tan(\cos_A \cdot \sin_A)$ repeats the increase and decrease in 64 cycles, while a $\tan(\cos_B \cdot \sin_B)$ repeats the increase and decrease in 63 cycles, and a difference between a $\tan(\cos_A \cdot \sin_A)$ and a $\tan(\cos_B \cdot \sin_B)$ thus increases with an increase of a rotation angle when the rotating body 100 rotates once. Therefore, the absolute angle $\theta_{ref}$ can be calculated from Equation 1.

As illustrated in FIG. 6, in a case where a rotation angle (mechanical angle) of the rotating body 100 is 0°, a value of the absolute angle $\theta_{ref}$ is 0. The value of the absolute angle $\theta_{ref}$ periodically changes so as to increase with an increase of the mechanical angle, become a maximum at a mechanical angle $2\pi$ (rad), and be zero again at a mechanical angle $\theta$. Therefore, the rotation angle of the rotating body 100 is obtained from the value of the absolute angle $\theta_{ref}$. Meanwhile, since the absolute angle $\theta_{ref}$ obtained here is affected by a signal distortion due to a processing error of the rotating body 100, assembly errors of the detection units 200 and 210, or the like, a high accuracy cannot be expected.

Therefore, the following processing is performed to increase the accuracy. Here, a concept of slits is used. The slits can be represented by fan-shaped regions obtained by dividing one rotation (which is $2\pi$ [rad] and corresponds to a moving range of the rotating body 100) of the rotating body 100. When Track A is used for division of the slits, Track A has 64 cycles, such that 360°/64=5.625° and one slit has a fan shape with a central angle of 5.625°. One rotation of the rotating body 100 can be represented by 64 slits, such that 0 to 5.625° can be represented as a slit of slit number 1 and 5.625° to 11.25° can be represented by a slit of slit number 2. Therefore, as illustrated in FIG. 6, a slit (Slit) number corresponding to the absolute angle $\theta_{ref}$ can be obtained from the obtained absolute angle $\theta_{ref}$. That is, it can be obtained which slit the current absolute angle $\theta_{ref}$ corresponds to. In this manner, the slit number calculation unit 300 calculates the slit number corresponding to the absolute angle $\theta_{ref}$.

Figure 7:
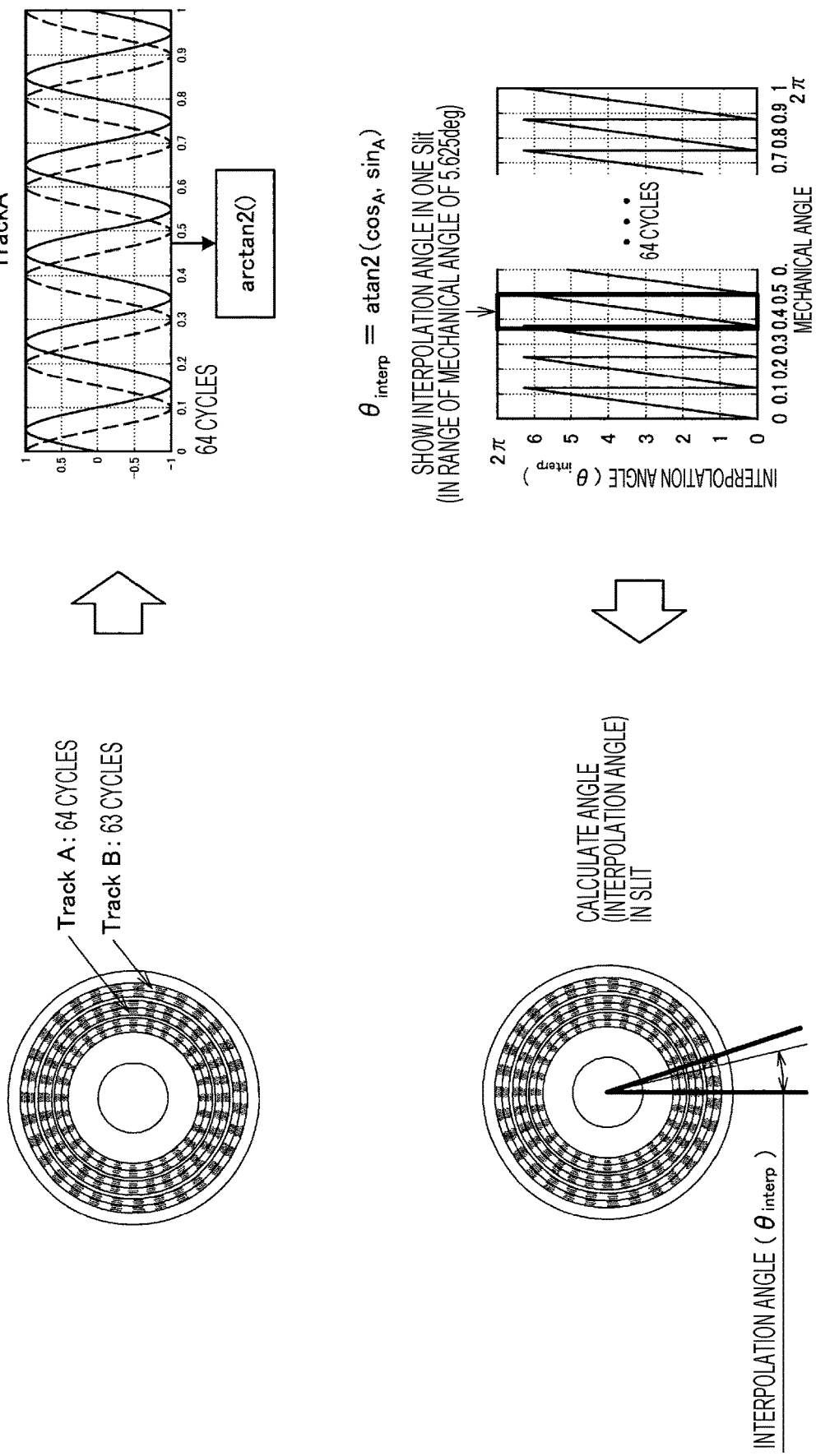
FIG. 7 is a schematic view illustrating processing performed by an interpolation angle calculation unit 400.

FIG. 7 is a schematic view illustrating processing performed by the interpolation angle calculation unit 400. As illustrated in FIG. 7, a value (a $\tan2(\cos_A \cdot \sin_A)$) obtained by calculating arctangent2 of the sin voltage and the cos voltage of Track A is an angle (interpolation angle $\theta_{interp}$) in one slit. In other words, the interpolation angle $\theta_{interp}$ can be obtained from the following Equation 2.

$$\theta_{interp} = a\tan2(\cos_A, \sin_A) \quad (2)$$

Since the right side of Equation 2 repeats an increase and decrease in 64 cycles each time the rotating body 100 rotates once, the interpolation angle $\theta_{interp}$ represents an angle in one slit. Therefore, the absolute angle can be obtained from the slit number and a value of the interpolation angle $\theta_{interp}$. Since a resolution of the absolute angle can increase by this calculation method, the accuracy can be improved as compared with a case of obtaining $\theta_{ref}$ described above.

FIG. 8 is a schematic view illustrating an absolute angle represented by a slit number and an interpolation angle. As illustrated in FIG. 8, the absolute angle is represented using the slit number as an upper bit and using the interpolation angle as a lower bit. The absolute angle calculation unit 500 combines the slit number and the interpolation angle with each other to calculate the absolute angle as illustrated in FIG. 8.

By the way, when the slit number is obtained, if the absolute angle $\theta_{ref}$ is an angle near a boundary of the slit, an error may occur in calculation of a slit number near the boundary of the slit. For example, an angle error occurs due to an influence of a signal distortion, or the like, such that the slit number may be erroneously determined as an adjacent slit number. When the slit number is erroneous, the finally calculated absolute angle is deviated by an angle corresponding to one slit. In the method of calculating the absolute angle described above, it difficult to correct this angle deviation.

Figure 9:
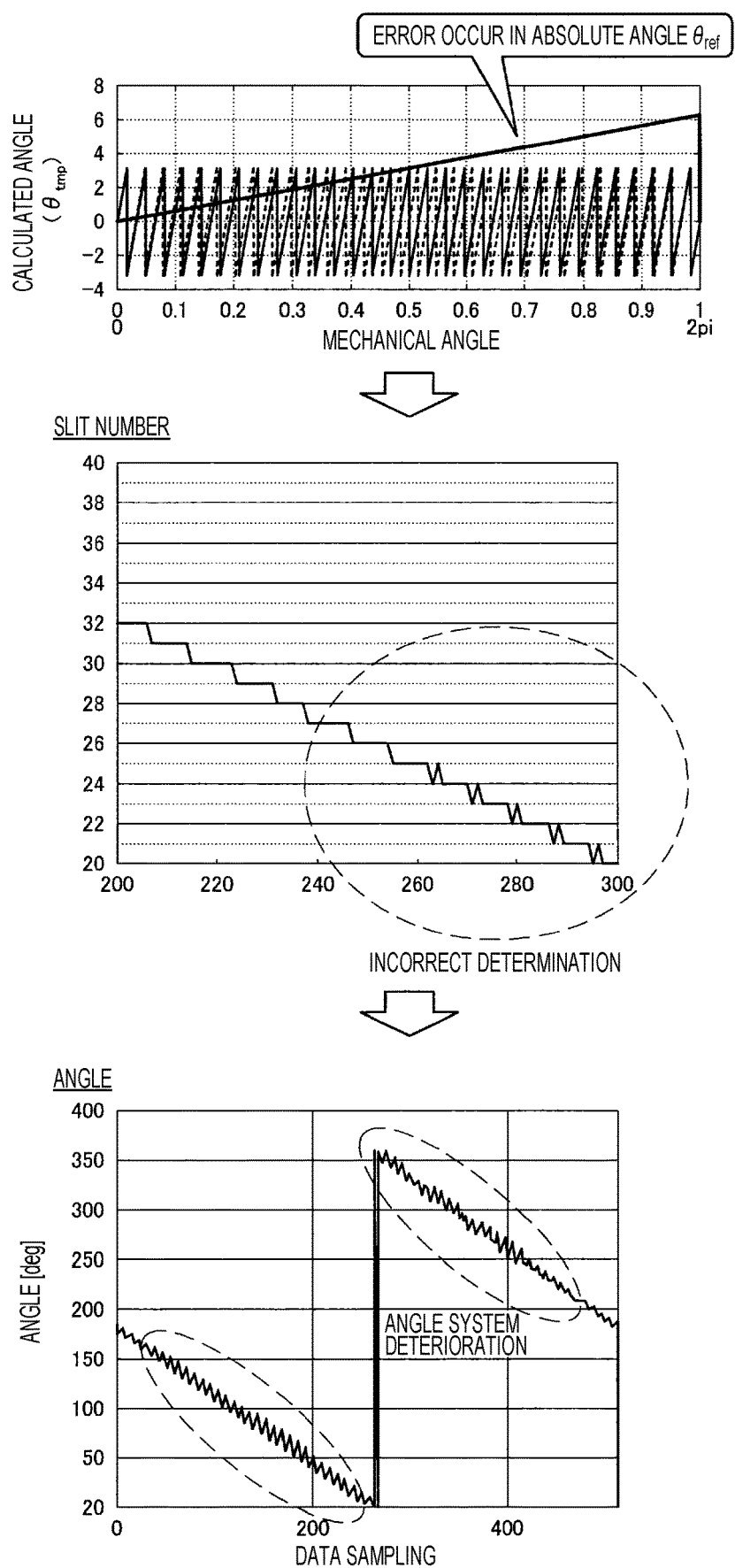
FIG. 9 is a schematic view for describing a situation in which an error occurs in calculation of the slit number.

FIG. 9 is a schematic view for describing a situation in which an error occurs in calculation of the slit number. An upper diagram in FIG. 9 illustrates a situation in which an angle error occurs in the absolute angle $\theta_{ref}$ due to an influence or the like of a signal distortion, a cycle deviation, a signal offset, and the like, of the cos voltage and the sin voltage. The signal distortion occurs due to a processing accuracy of the rotating body 100, a deviation of relative positions between the rotating body 100 and the detection units 200 and 210, and the like.

When the angle error occurs in the absolute angle $\theta_{ref}$, a calculation result of the slit number is deviated as illustrated in an intermediate diagram of FIG. 9. In particular, when the absolute angle $\theta_{ref}$ is the angle near the boundary of the slit, an error occurs in a calculation result of the slit number (vertical axis). As a result, as illustrated in a lower diagram of FIG. 9, a deviation occurs in the detected angle (vertical axis). When an error occurs by one slit in the slit number, an angle deviation of 360°/number of cycles occurs. In a case where the number of cycles is 64, when the slit number is deviated by one, an angle position is deviated by 5.625°.

Figure 10:
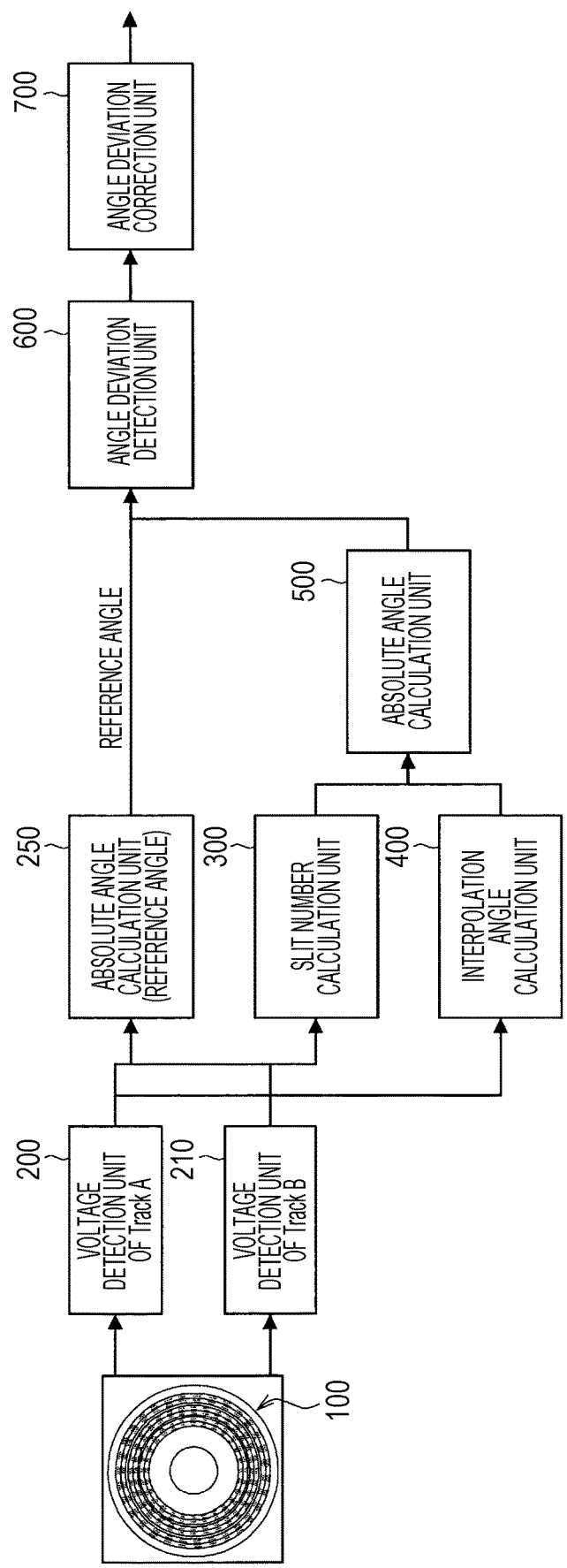
FIG. 10 is a block diagram illustrating a configuration of a position detection device according to the present embodiment.

2. Configuration Example of Position Detection Device According to Present Embodiment FIG. 10 is a block diagram illustrating a configuration of a position detection device according to the present embodiment. Also in the angle detection device illustrated in FIG. 10, the absolute angle of the rotating body 100 including two tracks A and B illustrated in FIG. 3 is detected. The position detection device includes a detection unit 200 of Track A, a detection unit 210 of Track B, an absolute angle calculation unit (reference position calculation unit) 250, a slit number calculation unit (slit specifying unit) 300, an interpolation angle calculation unit (in-slit position calculation unit) 400, an absolute angle calculation unit (absolute position calculation unit) 500, an angle deviation detection unit 600, and an angle deviation correction unit 700.

As described above, the rotating body 100 includes tracks A and B configured by a gear or rugged shape or magnetization. A cycle difference between. Track A and Track B is 1. Furthermore, as described above, one cycle of teeth, irregularities, and magnetization is referred to as a slit. For example, in a case where Track A has 64 slits, Track B has 63 slits.

Rotation and movement of Track A are detected by the detection unit 200 of Track A. Furthermore, rotation and movement of Track B are detected by the detection unit 210 of Track B. Two sinusoidal waves (sin voltage and cos voltage) having a phase difference of 90° therebetween are obtained from the respective voltage detection units. The absolute angle calculation unit 250 calculates the absolute angle $\theta_{ref}$ (reference angle) on the basis of Equation 1. By calculating arctangent2 (a tan2) of the signals of each of Track A and Track B and taking a difference between arctangent2 (a tan2) of the signals, it is possible to obtain the absolute angle $\theta_{ref}$ using the cycle difference between Track A and Track B.

As described above, since a distortion occurs in the signal due to mechanical errors of components or assembly errors of the detection units 200 and 210, a sufficient accuracy is not obtained with the absolute angle $\theta_{ref}$ obtained by Equation 1. However, according to Equation 1, an approximate angle can be known. Therefore, in the present embodiment, the absolute angle $\theta_{ref}$ is used as a reference angle at the time of detecting an angle deviation of the absolute angle obtained by another method with a higher accuracy. An error of the reference angle here should be equal to or less than ±360/2Na [deg] in which Na is the number of slits in Track A. In a case where this condition is not satisfied, an angle calculation method in a 3-track manner is used.

The absolute angle calculation unit 500 calculates an absolute angle by another method having a higher accuracy than that of the absolute angle $\theta_{ref}$. This method is performed by the slit number calculation unit 300 and the interpolation angle calculation unit 400 described above. First, the slit number calculation unit 300 calculates which slit the absolute angle $\theta_{ref}$ corresponds to. In other words, the slit number calculation unit 300 calculates a slit number corresponding to the absolute angle $\theta_{ref}$.

At the same time, the interpolation angle calculation unit 400 calculates an interpolation angle in one slit. The interpolation angle calculation unit 400 calculates an interpolation angle in a slit, in the slit of the slit number calculated by the slit number calculation unit 300.

The absolute angle calculation unit 500 calculates an absolute angle $\theta_{enc}$ on the basis of the slit number calculated by the slit number calculation unit 300 and the interpolation angle calculated by the interpolation angle calculation unit 400. By calculating the absolute angle $\theta_{enc}$ by this method, a calculation accuracy of the absolute angle $\theta_{enc}$ can be improved as the number of slits in one track increases. Meanwhile, when the number of slits increases, a possibility that the reference absolute angle $\theta_{ref}$ will be positioned near the boundary of the slit increases, and in a case of calculating the slit number on the basis of the absolute angle $\theta_{ref}$, a possibility of misreading the slit number at a boundary portion of the slit increases. As described above, in a case where one slit number is misread, a value of the absolute angle $\theta_{enc}$ is deviated by an angle corresponding to one slit. Therefore, in the present embodiment, processing for correcting this angle deviation is performed.

The angle deviation detection unit 600 detects an angle deviation due to the misreading of the slit number. Specifically, the angle deviation detection unit 600 determines whether or not there is an error in determination of the slit number on the basis of a magnitude of a difference $\Delta\theta$ between the absolute angle $\theta_{ref}$ and the absolute angle $\theta_{enc}$ with reference to the absolute angle $\theta_{ref}$ (reference angle) calculated in advance. The angle deviation detection unit 600 determines the magnitude of the difference $\Delta\theta$ on the basis of the following Equation 2, and determines that there is an error in the determination of the slit number in a case of the following Equation 2 is established.

[Equation 1]

$$|\Delta\theta| > \frac{1}{2} \cdot \frac{360 deg}{N_A} \qquad (2)$$

In other words, an angle error $\Delta\theta_{ref}$ of the absolute angle $\theta_{ref}$ is only required to satisfy the following Equation 3. If the angle error $\Delta\theta_{ref}$ of the absolute angle $\theta_{ref}$ satisfies the following Equation 3, even though the angle error $\Delta\theta_{ref}$ occurs, it does not exceed a boundary of an adjacent slit, such that erroneous determination of the slit number does not occur.

[Equation 2]

$$|\Delta\theta_{ref}| < \frac{1}{2} \cdot \frac{360 deg}{N_A} \qquad (3)$$

Figure 11:
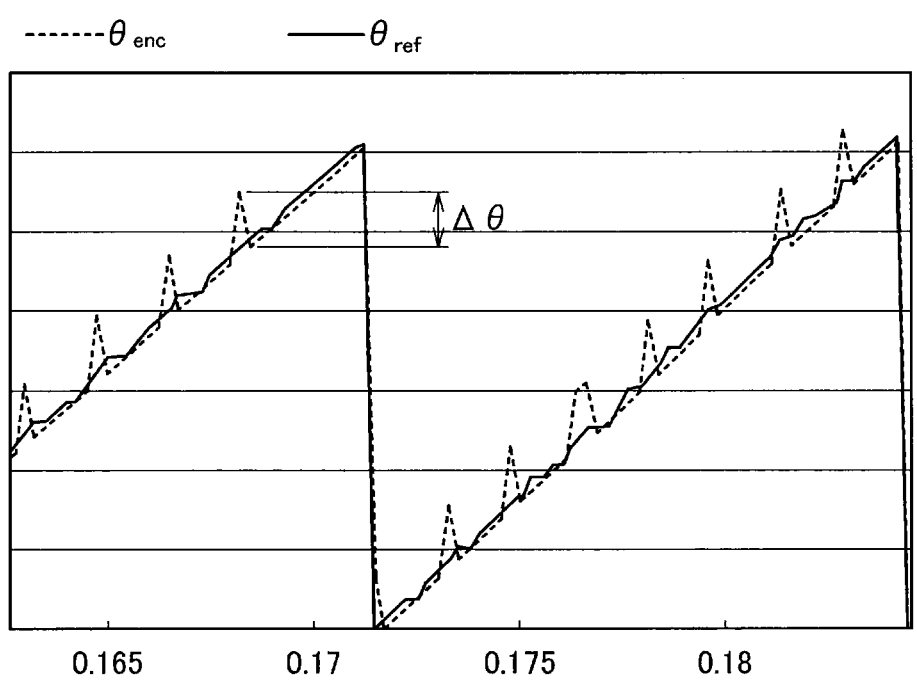
FIG. 11 is a characteristic diagram illustrating a difference $\Delta\theta$ between an absolute angle $\theta_{ref}$ and an absolute angle $\theta_{enc}$.

FIG. 11 is a characteristic diagram illustrating the difference $\Delta\theta$ between the absolute angle $\theta_{ref}$ and the absolute angle $\theta_{enc}$. As illustrated in FIG. 11, it can be seen that a value of $\Delta\theta$ periodically increases. A timing at which $\Delta\theta$ increases indicates that the absolute angle $\theta_{ref}$ is a value near the boundary of the slit.

In a case where the angle deviation is detected by the angle deviation detection unit 600, the angle deviation correction unit 700 corrects the angle deviation due to a calculation error of the slit number. Specifically, the angle deviation correction unit 700 obtains the number $N_{err}$ of slits in which the calculation error occurs from the difference $\Delta\theta$ on the basis of the following Equation 4. The number $N_{err}$ of slits corresponds to the number of slits in which the calculation error occurs.

[Equation 3]

$$N_{err} = \text{round}\left(\frac{\Delta\theta}{360\,deg/N_A}\right) \qquad (4)$$

For example, in a case where the determined slit number is deviated from a correct value by "2", $N_{err}=2$. The angle deviation correction unit 700 calculates an absolute angle $\theta_m$ in which the angle deviation is compensated for on the basis of the number of slits $N_{err}$ in which the calculation error occurs, on the basis of the following Equation 5. In a case where the determined slit number is deviated from the correct value by "1", the absolute angle $\theta_{enc}$ is corrected by 5.625°, such that the absolute angle $\theta_m$ is calculated. Similarly, in a case where the determined slit number is deviated from the correct value by "2", the absolute angle $\theta_{enc}$ is corrected by 11.25°, such that the absolute angle $\theta_m$ is calculated.

[Equation 4]

$$\theta_m = \theta_{enc} - N_{err} \cdot \frac{360 deg}{N_A} \qquad (5)$$

As described above, the angle deviation detection unit 600 determines whether or not there is an error in determination of the slit number on the basis of a magnitude of a difference from the reference angle with reference to the reference angle (absolute angle $\theta_{ref}$) calculated in advance. Then, in a case where the error occurs in the determination of the slit number, the angle deviation due to the calculation error of the slit number is corrected by the angle deviation correction unit 700. Therefore, it is possible to detect the position of the rotating body 100 with a high accuracy.

Figure 12:
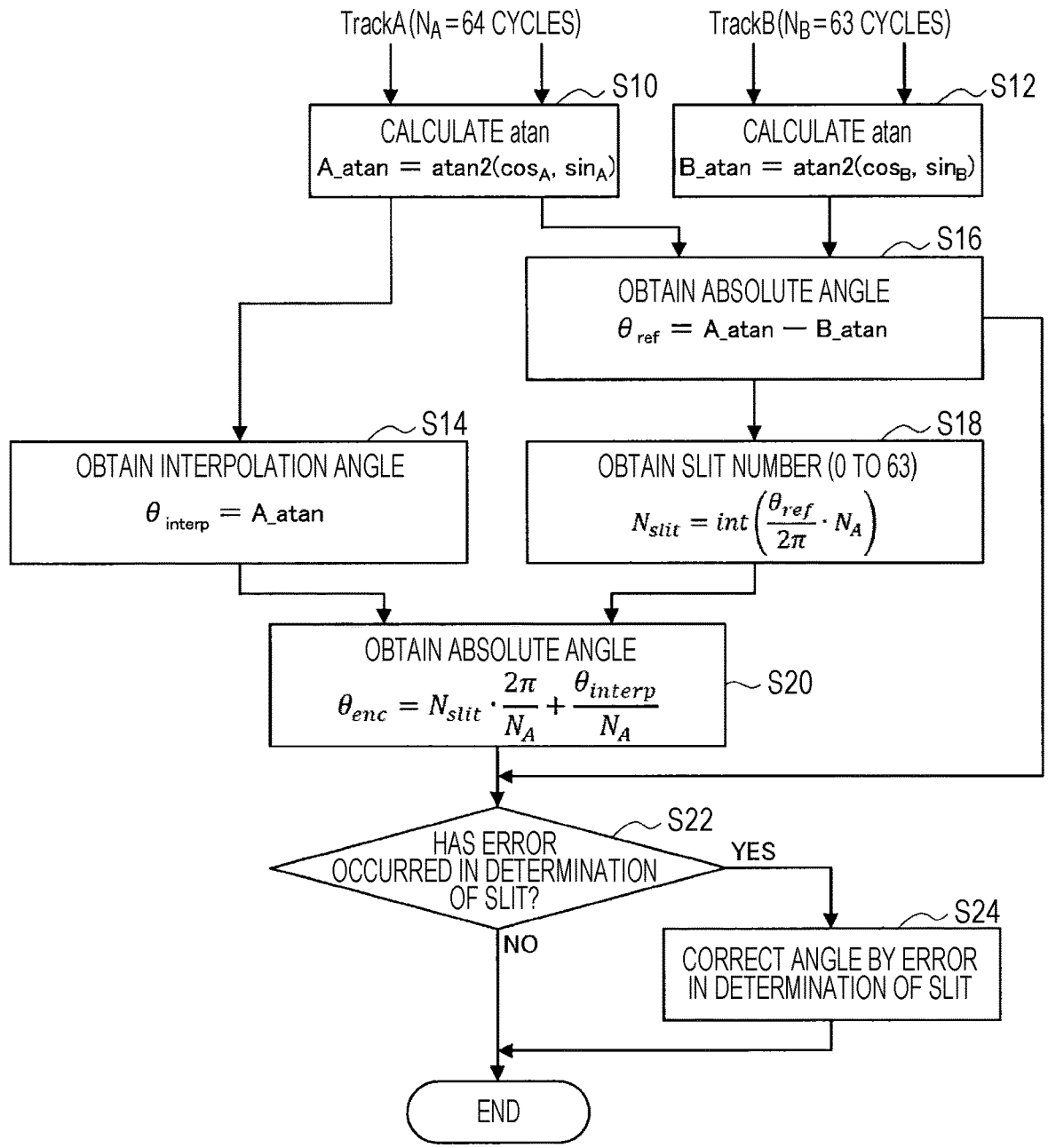
FIG. 12 is a flowchart illustrating processing performed by the position detection device of FIG. 10.

FIG. 12 is a flowchart illustrating processing performed by the position detection device of FIG. 10. First, in step S10, arctangent2 (a tan2) of the sin voltage and the cos voltage of Track A is calculated. In step S12, arctangent2 (a tan2) of the sin voltage and the cos voltage of Track B is calculated. In step S16, the absolute angle $\theta_{ref}$ is calculated by taking a difference between the values obtained in steps S10 and S12.

Furthermore, in step 814, arctangent2 (a tan2) of the sin voltage and the cos voltage of Track A is calculated to calculate the interpolation angle. In step S18, the slit number is calculated on the basis of the absolute angle $\theta_{ref}$.

In step S20, the absolute angle $\theta_{enc}$ is calculated from the slit number and the interpolation angle using Equation illustrated in step S20. In the next step S22, the absolute angle $\theta_{enc}$ obtained in step 820 and the absolute angle $\theta_{ref}$ (reference angle) are compared with each other to determine whether or not an error has occurred in the determination of the slit number. In a case where the error has occurred in the determination of the slit number, the processing proceeds to step S24, and the angle is corrected by the error in the slit determination. After step S24, the processing ends. Furthermore, in a case where the error has not occurred in the determination of the slit number in step S22, the processing ends.

3. Configuration Example in Case of Three Tracks

Figure 13:
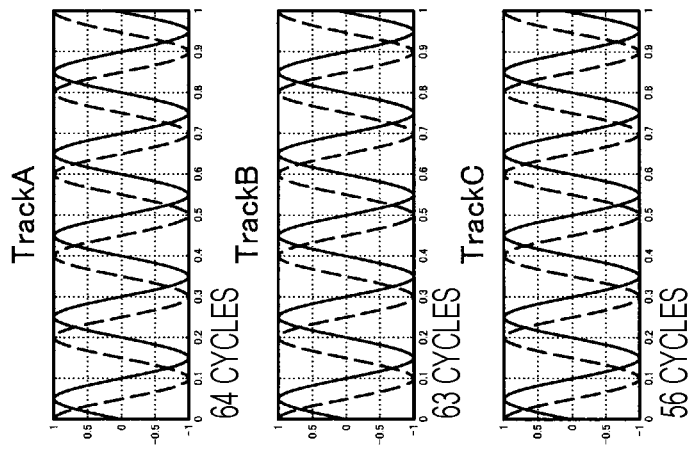
FIG. 13 is a schematic view illustrating a rotating body 100 including three tracks A to C and voltage waveforms obtained from each of the tracks A to C.
Figure 13:
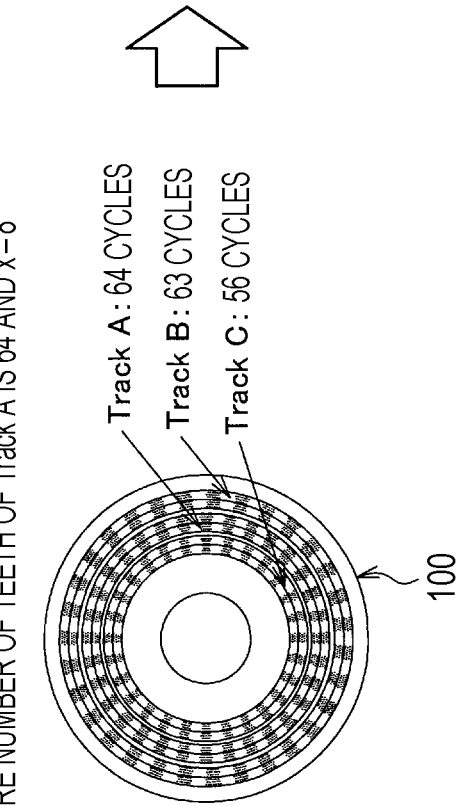

Next, a configuration example in which a rotating body 100 includes three tracks A, B, and C will be described. FIG. 13 is a schematic view illustrating a rotating body 100 including three tracks A to C and voltage waveforms obtained from each of tracks A to C. In a case of the three tracks, Track A has n cycles, Track B has (n-1) cycles, and Track C has (n-x) cycles. For example, in a case where n=64 and x=8, Track A has 64 cycles. Track B has 63 cycles, and Track C has 56 cycles. Similar to the case of the two tracks, in the case of the three tracks, two voltage waveforms (cos voltage and sin voltage) having a phase difference of 90° therebetween can be obtained from each track.

Figure 14:
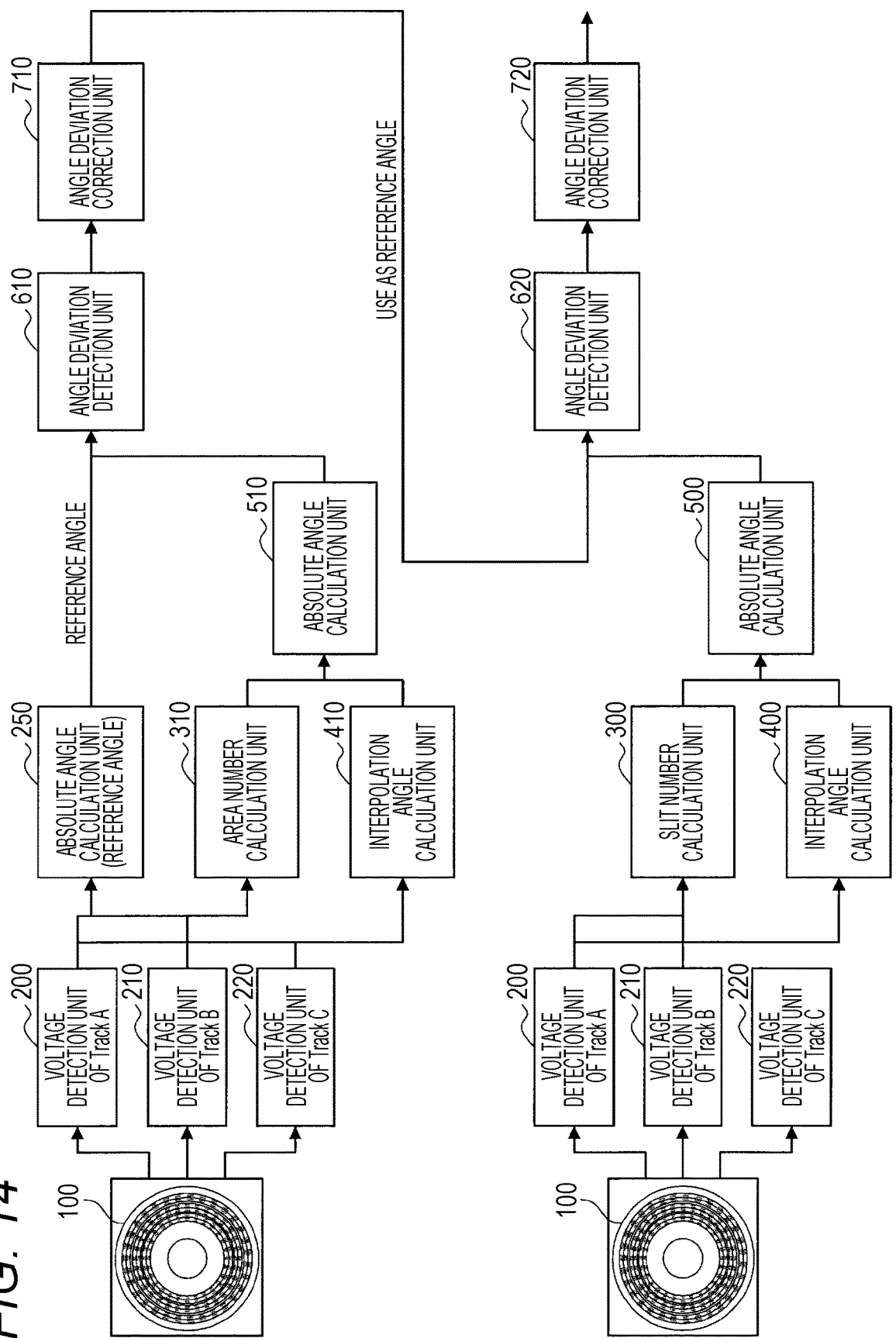
FIG. 14 is a schematic view illustrating a configuration of the position detection device in a case where the rotating body 100 includes the three tracks A to C.

FIG. 14 is a schematic view illustrating a configuration of the position detection device in a case where the rotating body 100 includes the three tracks A to C. As illustrated in FIG. 14, the position detection device includes a detection unit 200 of Track A, a detection unit 210 of Track B, a detection unit 220 of Track C, an absolute angle calculation unit 250, an area number calculation unit (area specifying unit) 310, an interpolation angle calculation unit 410, an absolute angle calculation unit (second absolute position calculation unit) 510, an angle deviation detection unit 610, an angle deviation correction unit 710, a slit number calculation unit 300, an interpolation angle calculation unit 400, an absolute angle calculation unit 500, an angle deviation detection unit 620, and an angle deviation correction unit 720.

In a method of using the three tracks, Track C having a certain cycle difference with respect to Track A is added to make an influence of an error smaller, such that an angle deviation is more certainly corrected. There is no problem in principle even though a cycle difference between Track A and Track C is an arbitrary value. However, as the cycle difference between Track A and Track C becomes larger, an accuracy is improved, but it becomes difficult to detect a slit number determination error, such that there is a trade-off relationship between the accuracy and the detection of the slit number determination error. Therefore, it is desirable to select an appropriate cycle difference between Track A and Track C from an inherent error. As an example, assuming that the cycle difference between Track A and Track C is 8 as described above, Track A has 64 cycles, Track B has 63 cycles, and Track C has 56 cycles.

In the configuration illustrated in FIG. 14, processing performed by the detection unit 200 of Track A, the detection unit 210 of Track B, the absolute angle calculation unit 250, the slit number calculation unit 300, the interpolation angle calculation unit 400, and the absolute angle calculation unit 500 is similar to that of FIG. 10.

Figure 17:
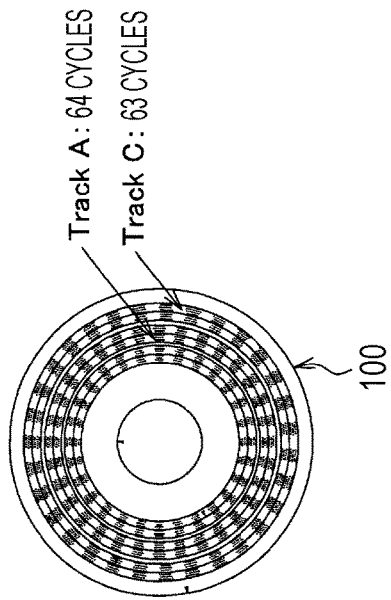
FIG. 17 is a schematic view illustrating a method of calculating an area number.
Figure 17:
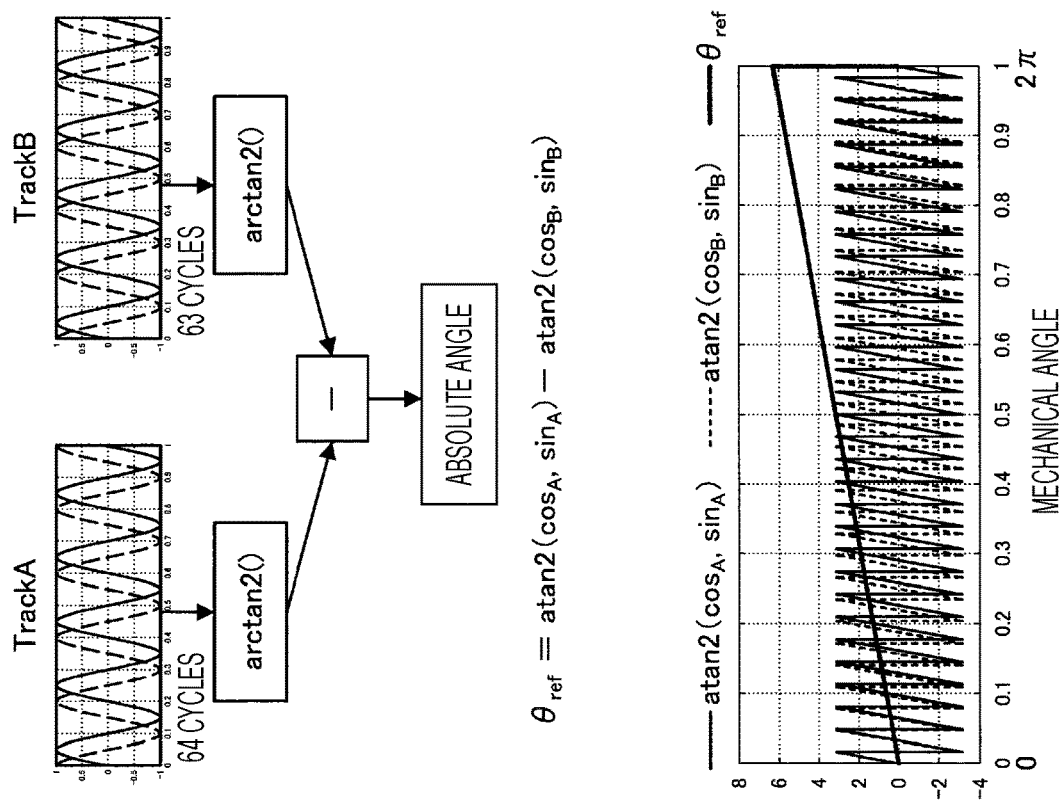
Figure 17:
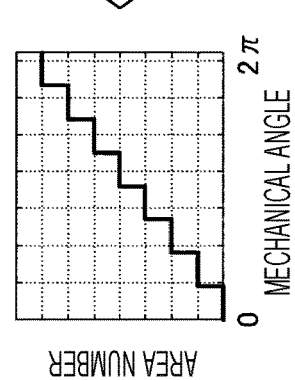
Figure 17:
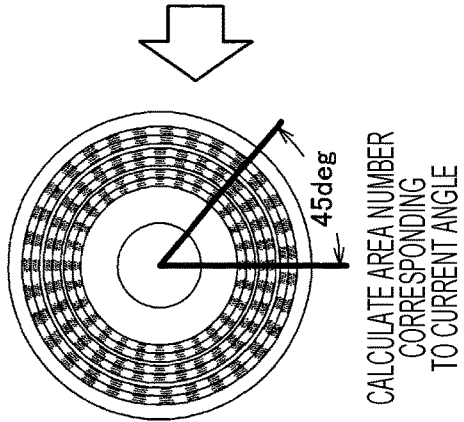

The area number calculation unit 310 calculates which area the absolute angle $\theta_{ref}$ corresponds to. Here, the area represents an angle zone obtained by equally dividing 360° by the cycle difference between Track A and Track C, and means a region of 45° obtained by dividing 360° into eight equal parts in a case where the cycle difference is 8. FIG. 17 is a schematic view illustrating a method of calculating an area number. The method of calculating the area number is similar to the method of calculating the slit number described in FIG. 6. As illustrated in FIG. 17, it is specified which area of the areas obtained by dividing the 360° (2π [rad]) into the eight equal parts the absolute angle $\theta_{ref}$ corresponds to. Since an angle of one area is larger than that of one slit, a probability that a value of the absolute angle $\theta_{ref}$ will exist near a boundary of an adjacent area is low.

Figure 18:
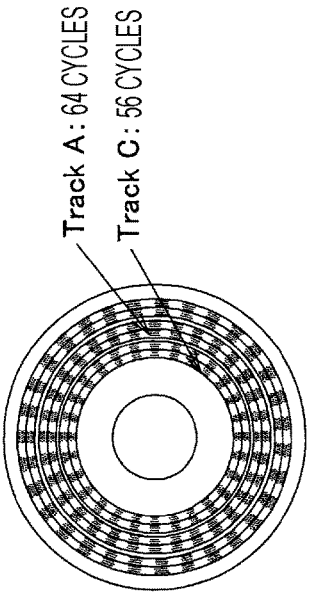
FIG. 18 is a schematic view illustrating a method of calculating an interpolation angle in an area.
Figure 18:
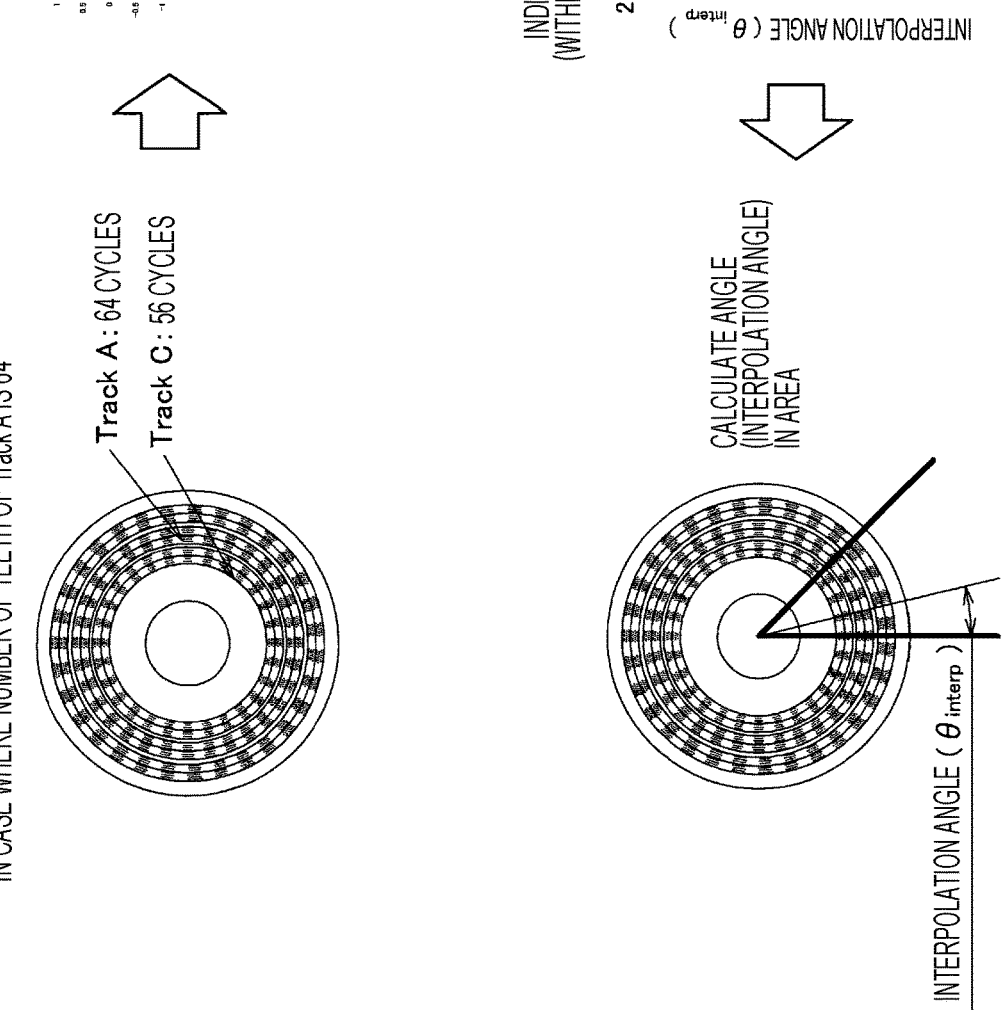

At the same time, the interpolation angle calculation unit 410 calculates an interpolation angle in the area. FIG. 18 is a schematic view illustrating a method of calculating an interpolation angle in an area. The interpolation angle in the area is obtained from a cycle difference (eight cycles) between the tracks by calculating arctangent2 (arc tan2) of the sin voltages and the cos voltages of tracks A and C and calculating a difference between arctangent2 (arc tan2) of the sin voltages and the cos voltages. As illustrated in FIG. 18 the interpolation angle $\theta_{interp}$ in the area can be obtained from the following Equation 6.

$$\theta_{interp} = a\tan2(\cos_A, \sin_A) - a\tan2(\cos_c, \sin_c) \quad (6)$$

Since Track C has 56 cycles, cycles of fluctuations of $\sin_c$ and $\cos_c$ are 56 cycles, respectively. Therefore, when arctangent2 of $\sin_c$ and $\cos_c$ is calculated, 56 cycles of an increase and decrease are repeated each time the rotating body 100 rotates once. Since the right side of Equation 6 repeats an increase and decrease in eight cycles, which is a cycle difference between Track A and the Track C, each time the rotating body 100 rotates once the interpolation angle $\theta_{interp}$ represents an angle within one area. Therefore, the absolute angle can be obtained from the area number and a value of the interpolation angle $\theta_{interp}$.

The absolute angle calculation unit 510 calculates an absolute angle $\theta_{enc1}$ from the calculated area number and the interpolation angle. As described above, since the angle of one area is larger than that of one slit, the probability that the value of the absolute angle $\theta_{ref}$ will exist near the boundary of the adjacent area is low, but an angle error may occur in the absolute angle $\theta_{enc1}$ obtained by the absolute angle calculation unit 510 due to a deviation in determination of the area number. For example, in a case where the area number calculation unit 310 erroneously determines an adjacent area number, in a case where the cycle difference between Track A and Track C is 8, an angular deviation of 360/8=45° corresponding to one area occurs. Therefore, a reference angle obtained by the absolute angle calculation unit 250 and the absolute angle obtained by the absolute angle calculation unit 510 are compared with each other to detect an angle deviation by the angle deviation detection unit 610 and correct the angle deviation by the angle deviation correction unit 710. Processing performed by the angle deviation detection unit 610 and the angle deviation correction unit 710 is basically similar to the processing performed by the angle deviation detection unit 600 and the angle deviation correction unit 700 illustrated in FIG. 10. The angle deviation detection unit 610 determines whether or not an angular deviation occurs on the basis of a difference between the absolute angle $\theta_{ref}$ obtained by the absolute angle calculation unit 250 and the absolute angle $\theta_{enc1}$ obtained by the absolute angle calculation unit 510. The angle deviation correction unit 710 corrects the absolute angle $\theta_{enc1}$ on the basis of the difference between the absolute angle $\theta_{ref}$ and the absolute angle $\theta_{enc1}$. Then, processing is performed by the angle deviation detection unit 620 and the angle deviation correction unit 720 using the angle after being corrected by the angle deviation correction unit 700, instead of the reference angle (absolute angle $\theta_{ref}$) in FIG. 10. The processing performed by the angle deviation detection unit 620 and the angle deviation correction unit 720 is similar to the processing performed by the angle deviation detection unit 600 and the angle deviation correction unit 700 of FIG. 10 except that the angle after being corrected by the angle deviation correction unit 700 is used as the reference angle.

Figure 15:
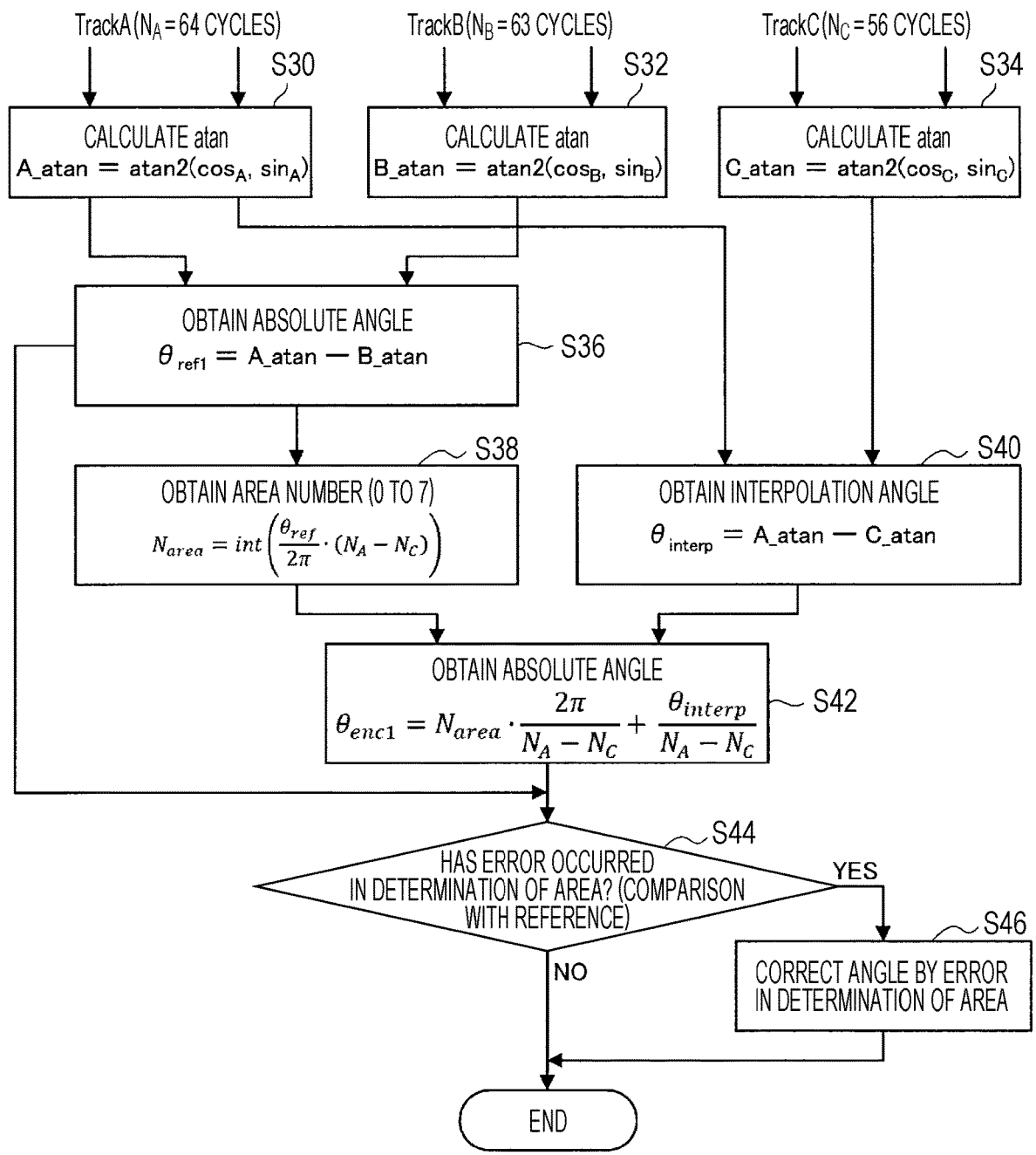
FIG. 15 is a flowchart illustrating processing performed by the position detection device illustrated in FIG. 14.
Figure 16:
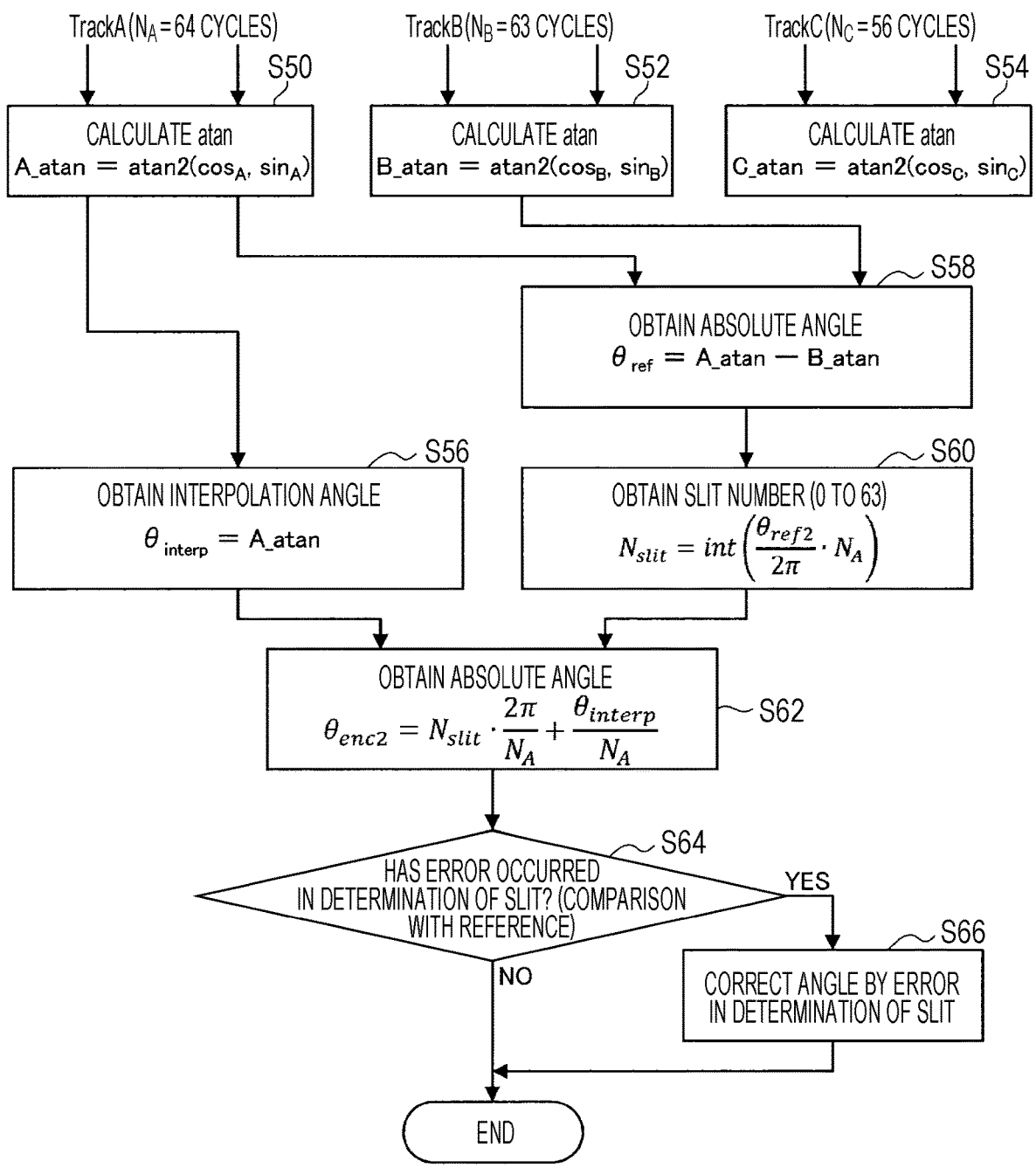
FIG. 16 is a flowchart illustrating processing performed by the position detection device illustrated in FIG. 14.

FIGS. 15 and 16 are flowcharts illustrating processing performed by the position detection device illustrated in FIG. 14. FIG. 15 illustrates processing performed by the absolute angle calculation unit. 250, the area number calculation unit 310, the interpolation angle calculation unit 400, the absolute angle calculation unit 510, the angle deviation detection unit 610, and the angle deviation correction unit 710. First, in step S30, arctangent2 (a tan2) of the sin voltage and the cos voltage of Track A is calculated. In step S32, arctangent2 (a tan2) of the sin voltage and the cos voltage of Track B is calculated. The detection unit 220 of Track C detects rotation and movement of Track C. In step S34, arctangent2 (a tan2) of the sin voltage and the cos voltage of Track C is calculated.

In step S36, the absolute angle $\theta_{ref}$ is calculated by taking a difference between the values obtained in steps S30 and S32. In step S38, an area number $N_{area}$ is determined by using Equation in step S38, using the absolute angle $\theta_{ref}$, a cycle $N_A$ of Track A, and a cycle $N_C$ of Track C.

In step S40, an interpolation angle $\theta_{interp}$ in the area is calculated by taking a difference between the values obtained in steps S30 and S34. In step S42, the absolute angle $\theta_{enc1}$ is calculated from the area number and the interpolation angle $\theta_{interp}$ using Equation illustrated in step S42. In the next step S44, the absolute angle $\theta_{enc1}$ obtained in step S42 and the absolute angle $\theta_{ref}$ (reference angle) are compared with each other to determine whether or not an error has occurred in the determination of the area number. In a case where the error has occurred in the determination of the area number, the processing proceeds to step S46, and the absolute angle $\theta_{enc1}$ is corrected by the error in the area. determination. After step S46, the processing temporarily ends. Furthermore, in a case where the error has not occurred in the determination of the area number in step S44, the processing temporarily ends.

FIG. 16 illustrates processing performed by the slit number calculation unit 300 and the interpolation angle calculation units 400400, 500, 620, and 720. First, in step S50, arctangent2 (a tan2) of the sin voltage and the cos voltage of Track A is calculated. In step S52, arctangent2 (a tan2) of the sin voltage and the cos voltage of Track B is calculated. In step S54, arctangent2 (a tan2) of the sin voltage and the cos voltage of Track C is calculated.

In step S58, the absolute angle $\theta_{ref}$ is calculated by taking a difference between the values obtained in steps S50 and S52. In step S60, a slit number $N_{slit}$ is determined by using Equation in step S60, using the absolute angle $\theta_{ref}$ and a cycle $N_A$ of Track A. Furthermore, in step S56, the value obtained in step S50 is taken as an interpolation angle $\theta_{interp}$.

In step S62, an absolute angle $\theta_{enc2}$ is calculated from the slit number $N_{slit}$ and the interpolation angle $\theta_{interp}$ using Equation illustrated in step S62. In the next step S64, the absolute angle $\theta_{enc2}$ obtained in step S62 and the absolute angle $\theta_{enc1}$ corrected in step S46 of FIG. 15 are compared with each other to determine whether or not an error has occurred in the determination of the slit number. In a case where the error has occurred in the determination of the slit number, the processing proceeds to step S66, and the angle is corrected by the error in the slit determination. After step S66, the processing ends. Furthermore, in a case where the error has not occurred in the determination of the slit number in step S64, the processing ends.

Hereinabove, the preferred embodiments of the present disclosure have been described in detail with reference to the accompanying drawings, but the technical scope of the present disclosure is not limited to such embodiments. It will be apparent to those skilled in the art of the present disclosure that various modifications or alterations can be conceived within the scope of the technical idea described in the claims, and it is naturally understood that these modifications or alterations also fall within the technical scope of the present disclosure.

Furthermore, the effects described in the present specification are only illustrative or exemplary rather than being restrictive. That is, the technology according to the present disclosure can accomplish other effects apparent to those skilled in the art from the description of the present specification, in addition to or instead of the effects described above.

Note that the following configurations also fall within the technical scope of the present disclosure.

(1)

A position detection device including:

a reference position calculation unit that calculates a reference position of a moving body on the basis of a first signal and a second signal, the first signal being detected from a first track provided on the moving body and having a scale of predetermined cycles, and the second signal being detected from a second track provided on the moving body and having a scale of cycles less than the predetermined cycles;

a slit specifying unit that specifies a slit corresponding to a position of the moving body among a plurality of slits on the basis of the reference position, the plurality of slits being obtained by dividing a moving range of the moving body;

an in-slit position calculation unit that calculates an in-slit position of the moving body in the specified slit on a basis of the first signal; and a correction unit that corrects an absolute position of the moving body on the basis of the absolute position and the reference position, the absolute position being calculated on the basis of the specified slit and the in-slit position.

(2)

The position detection device according to the above (1), in which the first signal includes two sinusoidal waves having a phase difference of 90° therebetween, and the second signal includes two sinusoidal waves having a phase difference of 90° therebetween.

(3)

The position detection device according to the above (2), in which the reference position calculation unit calculates the reference position from a difference between a first value and a second value, the first value being obtained by calculating an arctangent of the two sinusoidal waves of the first signal, and the second value being obtained by calculating an arctangent of the two sinusoidal waves of the second signal.

(4)

The position detection device according to any one of the above (1) to (3), further including a detection unit that detects whether or not a position deviation occurs between the reference position and the absolute position on the basis of a difference between the reference position and the absolute position, in which the correction unit corrects the absolute position on the basis of the difference in a case where it is detected by the detection unit that the position deviation occurs.

(5)

The position detection device according to the above (4), in which the detection unit detects that the position deviation occurs in a case where the difference is larger than half of the predetermined cycles.

(6)

The position detection device according to the above (2), in which the in-slit position calculation unit calculates the in-slit position on the basis of a first value obtained by calculating an arctangent of the two sinusoidal waves of the first signal.

(7)

The position detection device according to any one of the above (1) to (6), further including as absolute position calculation unit that calculates the absolute position of the moving body.

(8)

The position detection device according to any one of the above (1) to (7), further including:

a first signal detection unit that detects the first signal; and a second signal detection unit that detects the second signal.

(9)

The position detection device according to claim 1, further including:

an area specifying unit that specifies an area corresponding to a position of the moving body among a plurality of areas on the basis of the reference position, the plurality of areas being obtained by dividing a moving range of the moving body;

an in-area position calculating unit that calculates an in-area position of the moving body in the specified area on the basis of the first signal and a third signal, the third signal being detected from a third track provided on the moving body and having a scale of cycles less than the predetermined cycles; and a second correction unit that corrects a second absolute position of the moving body on the basis of the second absolute position and the reference position, the second absolute position being calculated on the basis of the specified area and the in-area position, in which the correction unit corrects the absolute position on the basis of the second absolute position and the absolute position using the second absolute position instead of the reference position.

(10)

The position detection device according to the above (9), further including a second detection unit that detects whether or not a position deviation occurs between the reference position and the second absolute position on the basis of a difference between the reference position and the second absolute position, in which the second correction unit corrects the second absolute position on the basis of the difference in a case where it is detected by the second detection unit that the position deviation occurs.

(11)

The position detection device according to the above (9), in which the in-area position calculation unit calculates the in-area position from a difference between a first value and a third value, the first value being obtained by calculating an arctangent of the two sinusoidal waves of the first signal, and the third value being obtained by calculating an arctangent of the two sinusoidal waves of the third signal.

(12)

The position detection device according to any one of the above (9) to (11), further including a second absolute position calculation unit that calculates the second absolute position of the moving body.

(13)

The position detection device according to any one of the above (9) to (12), further including a third signal detection unit that detects the third signal.

(14)

The position detection device according to any one of the above (1) to (13), in which the moving body rotates around a rotation center.

(15)

The position detection device according to any one of the above (1) to (13), in which the moving body linearly moves.

(16)

The position detection device according to any one of the above (1) to (15), in which the scale is configured by a gear shape or a rugged shape provided on the moving body or is configured by alternately magnetizing N poles and S poles.

(17)

The position detection device according to the above (8), in which the first signal detection unit detects the first signal corresponding to a change in light or a change in a magnetic field due to movement of the scale of the first track, and the second signal detection unit detects the second signal corresponding to a change in light or a change in a magnetic field due to movement of the scale of the second track.

(18)

The position detection device according to any one of the above (1) to (17), in which the second track has a scale having cycles smaller by one cycle than the predetermined cycles.

(19)

A position detection method including:

calculating a reference position of a moving body on the basis of a first signal and a second signal, the first signal being detected from a first track provided on the moving body and having a scale of predetermined cycles, and the second signal being detected from a second track provided on the moving body and having a scale of cycles less than the predetermined cycles;

specifying a slit corresponding to a position of the moving body among a plurality of slits on the basis of the reference position, the plurality of slits being obtained by dividing a moving range of the moving body;

calculating an in-slit position of the moving body in the specified slit on the basis of the first signal; and correcting an absolute position of the moving body on the basis of the absolute position and the reference position, the absolute position being calculated on the basis of the specified slit and the in-slit position.

REFERENCE SIGNS LIST

100 Rotating body
200, 210, 220 Detection unit
250 First absolute angle calculation unit
300 Slit number calculation unit
310 Area number calculation unit
400 Interpolation angle calculation unit
500, 510 Absolute angle calculation unit 600 Angle deviation detection unit
700 Angle deviation correction unit

The invention claimed is:

1. A position detection device comprising:
circuitry configured to:
calculate a reference position of a moving body on a basis of a first signal and a second signal, the first signal being detected from a first track provided on the moving body and having a scale of predetermined cycles, and the second signal being detected from a second track provided on the moving body and having a scale of cycles less than the predetermined cycles;
specify a cycle corresponding to the reference position of the moving body among the scale of cycles of the first track on a basis of the reference position;
calculate an interpolation angle of the moving body in the specified cycle on a basis of the first signal;
calculate an absolute position of the moving body on a basis of a combination of the specified cycle and the interpolation angle;
detect a position deviation occurs between the reference position and the absolute position on a basis of a difference between the reference position and the absolute position being greater than a predetermined value set based on a total number of the predetermined cycles of the first track;
determine, based on the detected position deviation, a total number of cycles included in the difference between the reference position and the absolute position; and
calculate a corrected absolute position,
wherein the calculation of the corrected absolute position includes subtracting, from the absolute position, the determined total number of cycles included in the difference between the reference position and the absolute position,
wherein the total number of cycles included in the difference between the reference position and the absolute position is determined by rounding a value obtained by dividing the difference between the reference position and the absolute position by a number of degrees included in a cycle in the first track, and
wherein the corrected absolute position is determined by subtracting from the absolute position a value obtained by multiplying the total number of cycles by the number of degrees included in the cycle in the first track.

2. The position detection device according to claim 1, wherein the first signal includes two sinusoidal waves having a phase difference of 90° therebetween, and the second signal includes two sinusoidal waves having a phase difference of 90° therebetween.

3. The position detection device according to claim 2, wherein the circuitry is further configured to calculate the reference position from a difference between a first value and a second value, the first value being obtained by calculating an arctangent2 of the two sinusoidal waves of the first signal, and the second value being obtained by calculating an arctangent2 of the two sinusoidal waves of the second signal.

4. The position detection device according to claim 1, wherein the circuitry is further configured to detect that the position deviation occurs in a case where the difference is larger than half of the predetermined cycles.

5. The position detection device according to claim 2, wherein the circuitry is further configured to calculate the interpolation angle on a basis of a first value obtained by calculating an arctangent2 of the two sinusoidal waves of the first signal.

6. The position detection device according to claim 1, wherein the circuitry is further configured to:
detect the first signal; and
detect the second signal.

7. The position detection device according to claim 1, wherein the moving body rotates around a rotation center.

8. The position detection device according to claim 1, wherein the moving body linearly moves.

9. The position detection device according to claim 1, wherein the scale is configured by a gear shape or teeth provided on the moving body or is configured by alternately magnetizing N poles and S poles.

10. The position detection device according to claim 6, wherein the circuitry is further configured to:
detect the first signal corresponding to a change in light or a change in a magnetic field due to movement of the scale of the first track; and
detect the second signal corresponding to a change in light or a change in a magnetic field due to movement of the scale of the second track.

11. The position detection device according to claim 1, wherein the second track has a scale having cycles smaller by one cycle than the predetermined cycles.

12. The position detection device according to claim 1, wherein the total number of cycles included in the difference between the reference position and the absolute position is determined according to the following equation $$N_{err} = \text{round}\left(\frac{\Delta\theta}{360\ deg/N_A}\right),$$

wherein $N_{err}$ is the total number of cycles, $\Delta\theta$ is the difference between the reference position and the absolute position, and $N_A$ is a number of cycles in the first track,
wherein the corrected absolute position is calculated according to the following equation $$\theta_{nt} = \theta_{onc} - N_{err} \cdot \frac{360\ deg}{N_A},$$

and
wherein $\theta m$ is the corrected absolute position and $\theta_{enc}$ is the absolute position.

13. A position detection method comprising:
calculating a reference position of a moving body on a basis of a first signal and a second signal, the first signal being detected from a first track provided on the moving body and having a scale of predetermined cycles, and the second signal being detected from a second track provided on the moving body and having a scale of cycles less than the predetermined cycles;
specifying a cycle corresponding to the reference position of the moving body among the scale of cycles of the first track on a basis of the reference position;
calculating an interpolation angle of the moving body in the specified cycle on a basis of the first signal;
calculating an absolute position of the moving body on a basis of a combination of the specified cycle and the interpolation angle;

detecting a position deviation occurs between the reference position and the absolute position on a basis of a difference between the reference position and the absolute position being greater than a predetermined value set based on a total number of the predetermined cycles of the first track;

determining, based on the detected position deviation, a total number of cycles included in the difference between the reference position and the absolute position; and calculating a corrected absolute position, wherein the calculation of the corrected absolute position includes subtracting, from the absolute position, the determined total number of cycles included in the difference between the reference position and the absolute position, wherein the total number of cycles included in the difference between the reference position and the absolute position is determined by rounding a value obtained by dividing the difference between the reference position and the absolute position by a number of degrees included in a cycle in the first track, and wherein the corrected absolute position is determined by subtracting from the absolute position a value obtained by multiplying the total number of cycles by the number of degrees included in the cycle in the first track.

* * * * *